United States Patent [19]

Schreurs

[11] Patent Number: 4,939,577
[45] Date of Patent: Jul. 3, 1990

[54] RECEIVER AND DEMODULATION CIRCUIT SUITABLE FOR SAID RECEIVER

[75] Inventor: Louis P. M. Schreurs, Eindhoven, Netherlands

[73] Assignee: U.S. Philips Corporation, New York, N.Y.

[21] Appl. No.: 326,578

[22] Filed: Mar. 21, 1989

[30] Foreign Application Priority Data

Apr. 5, 1988 [NL] Netherlands .................. 8800849

[51] Int. Cl.⁵ .................. H04N 5/44; H04N 7/01; H04N 9/65; H04N 3/66
[52] U.S. Cl. .................. 358/188; 358/23; 358/166; 358/140
[58] Field of Search .......... 358/167, 140, 23, 166, 358/188

[56] References Cited

U.S. PATENT DOCUMENTS

| | | | |
|---|---|---|---|
| 4,322,746 | 3/1982 | Oguino | 358/167 |
| 4,327,432 | 4/1982 | Lang et al. | 368/126 |
| 4,527,187 | 7/1985 | Ohta | 358/23 |
| 4,531,148 | 7/1985 | Ohta | 358/21 R |
| 4,713,689 | 12/1987 | Veillard | 358/146 |
| 4,825,289 | 4/1989 | Ohta | 358/167 |
| 4,831,435 | 5/1989 | Song et al. | 358/167 |

FOREIGN PATENT DOCUMENTS

| | | | |
|---|---|---|---|
| 0086838 | 8/1983 | European Pat. Off. | 358/21 R |
| 0169093 | 1/1986 | European Pat. Off. | |

Primary Examiner—John K. Peng
Attorney, Agent, or Firm—Edward W. Goodman

[57] ABSTRACT

In a receiver for television signals which are frequency-modulated on a carrier, having a demodulation circuit provided with a frequency demodulator (19), a detector (29, 35) with a level detector (29) for detecting a disturbed television signal and a correction circuit (5, 9, 11; 53, 59, 49; 39) for correcting the disturbed television signal, the correction circuit has a control signal input (33, 37) which is coupled to an output (31) of the detector (29, 35), an input (27) of the level detector (29) for detecting interference pulses in a demodulated television signal being coupled to an output (21) of the frequency demodulator (19), and the correction circuit (5, 9, 11; 53, 59, 49; 39) including a delay circuit (53, 59, 49).

4 Claims, 1 Drawing Sheet

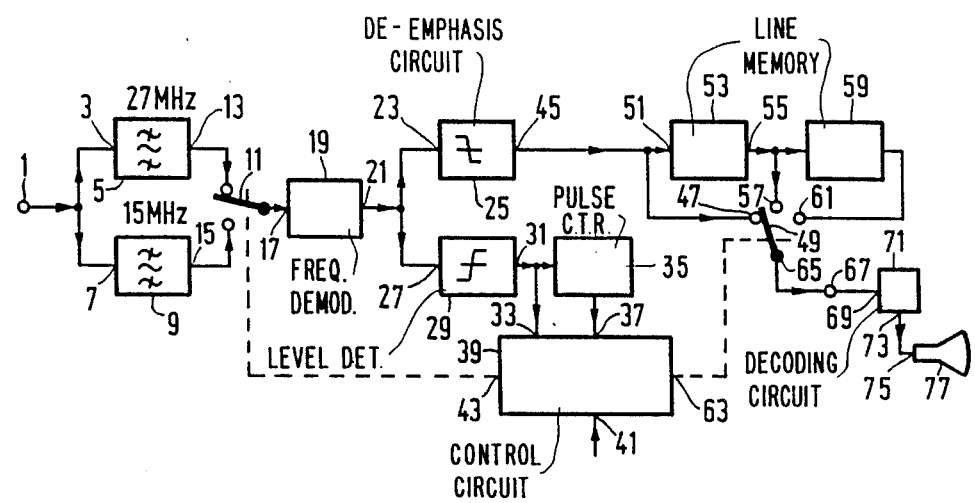

RECEIVER AND DEMODULATION CIRCUIT SUITABLE FOR SAID RECEIVER

BACKGROUND OF THE INVENTION

1. Field of the Invention

The invention relates to a receiver for television signals which are frequency-modulated on a carrier, said receiver comprising a demodulation circuit provided with a frequency demodulator, a detector with a level detector for detecting a disturbed television signal, and a correction circuit for correcting the disturbed television signal, said correction circuit having a control signal input coupled to an output of the detector.

The invention also relates to a demodulation circuit suitable for said receiver.

2. Description of Related Art

A receiver and demodulation circuit of this type are known from European Patent Application EP-A 86,838. In the known demodulation circuit the television signal which is frequency-modulated on the carrier is applied to the level detector for limiting the passbandwidth of a bandpass filter connected to the input of the demodulation circuit in dependence upon an input signal level measured by said level detector, thus reducing the influence of noise and interference pulses in the television signal caused by an associated low carrier-to-noise (C/N) ratio.

SUMMARY OF THE INVENTION

It is an object of the invention to provide a receiver in which a disturbed television signal is detected in a simple manner and in which a satisfactory correction is also possible for seriously disturbed television signals. According to the invention a receiver of the type described in the opening paragraph is therefore characterized in that an input of the level detector for detecting interference pulses in a demodulated television signal is coupled to an output of the frequency demodulator, the correction circuit comprising a delay circuit.

Due to the measure according to the invention, it is sufficient to have a smaller, hence less expensive, and lighter satellite antenna which can more easily be aligned because of the larger aperture angle when receiving satellite television signals, or with equal antennas, the coverage area of the satellite service will be larger because strongly attenuated signals from satellites which are further remote can now also be received.

The invention is based on the recognition that in view of the relatively large amplitude of the interference pulses (sometimes even two or three times the maximum amplitude of the television signal), a very simple level detector may suffice for detecting interference pulses in a demodulated television signal. Disturbed parts of the television signal can subsequently be replaced by parts obtained with the aid of the delay circuit.

A first embodiment of the receiver according to the invention is characterized in that the detector further comprises an interference pulse counter and in that the correction circuit is adapted to limit the bandwidth of the disturbed television signal in dependence upon a position of the interference pulse counter, and/or to switch on the delay circuit, so that one or both of the two correction methods can be chosen in an adaptive manner, dependent on the number of interference pulses in the disturbed television signal.

A second embodiment of the receiver according to the invention, comprising a very simple delay circuit is characterized in that the delay circuit is adapted to supply corresponding parts of a previous line of the television signal instead of disturbed parts of a present line of the television signal.

A further elaboration of this receiver, which is suitable for processing television signals in accordance with, for example the PAL and MAC television transmission standards, is characterized in that the delay circuit comprises a change-over switch having a first television signal input for receiving a television signal which is delayed over one present line period of the television signal and a second television signal input for receiving a television signal which is delayed over two line periods of the television signal, the correction circuit having a control signal input for receiving a television transmission standard information signal.

BRIEF DESCRIPTION OF THE DRAWING

The invention will now be described in greater detail, by way of non-limitative example, with reference to the accompanying drawing, the single FIGURE of which shows a receiver with a demodulation circuit according to the invention.

DESCRIPTION OF THE PREFERRED EMBODIMENT

In the drawing a television signal which is frequency-modulated on a carrier is applied to an input 1 of the demodulation circuit. The input 1 is connected to an input 3 of a first bandpass filter 5 having a passbandwidth of, for example 27 MHz, and to an input 7 of a second bandpass filter 9 having a passbandwidth of, for example 15 MHz. A change-over switch 11 connects an output 13 of the first bandpass filter 5 or an output 15 of the second bandpass filter 9 to an input 17 of a frequency demodulator 19. Instead of using two bandpass filters 5 and 9 with a change-over switch 11, it is alternatively possible to use a single bandpass filter having an adjustable bandwidth, as described in the previously mentioned European Patent Application EP-A 86,838. An output 21 of the frequency demodulator 19 is connected to an input 23 of a de-emphasis circuit 25 and to an input 27 of a level detector 29. An output 31 of the level detector 29 is connected to a first control signal input 33 and via an interference pulse counter 35 to a second control signal input 37 of a control circuit 39. A television transmission standard information signal, indicating according to which television transmission standard the television signal is composed, is applied to a control signal input 41 of the control circuit 39. A first output 43 of the control circuit 39 supplies a control signal for the change-over switch 11.

An output 45 of the de-emphasis circuit 25 is connected to a first television signal input 47 of a change-over switch 49 and to an input 51 of a first line memory 53. An output 55 of the first line memory 53 is connected to a second television signal input 57 of the change-over switch 49 and via a second line memory 59 to a third television signal input 61 of the change-over switch 49. A second output 63 of the control circuit 39 supplies a control signal for the changeover switch 49. This control signal indicates whether the television signal is undisturbed or disturbed and in the latter case it also indicates according to which television transmission standard the television signal has been encoded. An output 65 of the change-over switch 49 applies a corrected television signal to an output 67 of the demodulation circuit. The output 67 of the demodulation circuit is connected to an input 69 of a decoding circuit 71, an output 73 of which is connected to an input 75 of a display device 77.

The demodulation circuit operates as follows. If there are no interference pulses or if the number of interference pulses is low, the change-over switch 49 is in the position shown, in which the output 45 of the de-emphasis circuit 25 is directly connected to the output 67 of the demodulation circuit. If the number of interference pulses is unacceptably high, the change-over switch 49 changes over to one of the two positions not shown, dependent on the relevant television transmission standard. Instead of disturbed parts of a line of the television signal, corresponding parts of a television signal delayed over one line period will be applied to the output 67 of the demodulation circuit in the case of, for example the PAL television transmission standard, and corresponding parts of a television signal delayed over two line periods will be applied to the output 67 of the demodulation circuit in the case of the MAC television transmission standard, because the chance of these corresponding parts also being disturbed is small. For the MAC television transmission standard in which chrominance and luminance signals are successively transmitted on each line of the television signal, it is alternatively possible to apply the television signal delayed over two line periods to the output 67 of the demodulation circuit during the chrominance part of a line of the television signal and to apply the television signal delayed over one line period to said output during the luminance part of a line of the television signal. Instead of a single change-over switch 49 having three television signal inputs 47, 57 and 61, it is alternatively possible to use a series arrangement of two change-over switches each having two television signal inputs, a first change-over switch of which selects between a television signal delayed over one line period and a television signal delayed over two line periods, dependent on a television transmission standard information signal, and a second changeover switch of which selects between an output signal of the first change-over switch or a non-delayed television signal, dependent on a disturbed-/undisturbed control signal. If a number of line memories and an adder were added to the delay circuit, the delay circuit could supply a line obtained by means of interpolation between a number of lines of the television signal, instead of a disturbed line of the television signal.

Dependent on the occurrence of interference pulses and/or the position of the interference pulse counter, the bandwidth of the signal applied to the input 17 of the frequency demodulator 19 can be limited. Preferably, the correction circuit according to the invention will first limit this bandwidth in the case of occurrence of interference pulses, and if the number of interference pulses is then still unacceptably high, it will apply corresponding parts of a delayed television signal to the output 67 of the demodulation circuit instead of disturbed parts of the television signal.

On reading the present description, those skilled in the art will be able to conceive numerous modifications; all these modifications are considered to be within the scope of the present invention.

What is claimed is:

1. A receiver for television signals which are frequency-modulated on a carrier, said receiver comprising a demodulation circuit provided with a frequency demodulator, a detector with a level detector for detecting a disturbed television signal, and a correction circuit for correcting the disturbed television signal, said correction circuit having a control signal input coupled to an output of the detector, characterized in that an input of the level detector for detecting interference pulses in a demodulated television signal is coupled to an output of the frequency demodulator, the correction circuit comprising a delay circuit.

2. A receiver as claimed in claim 1, characterized in that the detector further comprises an interference pulse counter and in that the correction circuit further comprises means for limiting the bandwidth of the disturbed television signal and means for switching on the delay circuit in dependence upon a position of the interference pulse counter.

3. A receiver as claimed in claim 1 or 2, characterized in that the delay circuit is supplied corresponding parts of a previous line of the television signal instead of disturbed parts of a line of the television signal.

4. A receiver as claimed in claim 3, characterized in that the delay circuit comprises a change-over switch having a first television signal input for receiving a television signal which is delayed over one line period of the television signal and a second television signal input for receiving a television signal which is delayed over two line periods of the television signal, the correction circuit having a control signal input for receiving a television transmission standard information signal.

* * * * *